(12) United States Patent
Asam et al.

(10) Patent No.: US 11,431,340 B2
(45) Date of Patent: Aug. 30, 2022

(54) DUAL POWER SUPPLY DETECTION CIRCUIT

(71) Applicant: NEXPERIA B.V., Nijmegen (NL)

(72) Inventors: Geethanadh Asam, Nijmegen (NL); Robert Mossel, Nijmegen (NL); Walter Luis Tercariol, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 17/142,544

(22) Filed: Jan. 6, 2021

(65) Prior Publication Data

US 2021/0250027 A1    Aug. 12, 2021

(30) Foreign Application Priority Data

Feb. 6, 2020   (EP) .................................... 20155927

(51) Int. Cl.
| | |
|---|---|
| *H03K 19/0948* | (2006.01) |
| *G01R 31/40* | (2020.01) |
| *H03K 3/037* | (2006.01) |
| *H03K 19/20* | (2006.01) |

(52) U.S. Cl.
CPC ......... *H03K 19/0948* (2013.01); *G01R 31/40* (2013.01); *H03K 3/0377* (2013.01); *H03K 19/20* (2013.01)

(58) Field of Classification Search
None
See application file for complete search history.

(56) References Cited

U.S. PATENT DOCUMENTS

| | | | | | |
|---|---|---|---|---|---|
| 5,770,493 | A | * | 6/1998 | Fulford, Jr. | ....... H01L 21/82385 438/303 |
| 6,157,227 | A | * | 12/2000 | Giovinazzi | .......... H03K 17/223 327/143 |
| 11,165,425 | B2 | * | 11/2021 | Asam | ................. H03K 19/0016 |
| 2018/0164351 | A1 | * | 6/2018 | Nirwan | ................. G01R 19/25 |

FOREIGN PATENT DOCUMENTS

| | | |
|---|---|---|
| CN | 105049028 A | 11/2015 |
| FR | 2757713 A1 | 6/1998 |

OTHER PUBLICATIONS

Extended European Search Report for corresponding European application EP20155927.5 7 pages, dated Aug. 4, 2020.

* cited by examiner

*Primary Examiner* — Jany Richardson
(74) *Attorney, Agent, or Firm* — Ruggiero, McAllister & McMahon LLC

(57) ABSTRACT

This disclosure relates to a dual power supply detection circuit including first and second input stage field effect transistors, an inverter stage, a feedback stage field effect transistor, and first and second compensation circuits. The inverter stage includes a complimentary pair of transistors, and the complementary pair of transistors includes an NMOS transistor and a PMOS transistor configured and arranged so that gate lengths of the PMOS and NMOS transistors are different. The disclosure also relates to an integrated circuit including a dual power supply detection circuit.

17 Claims, 8 Drawing Sheets

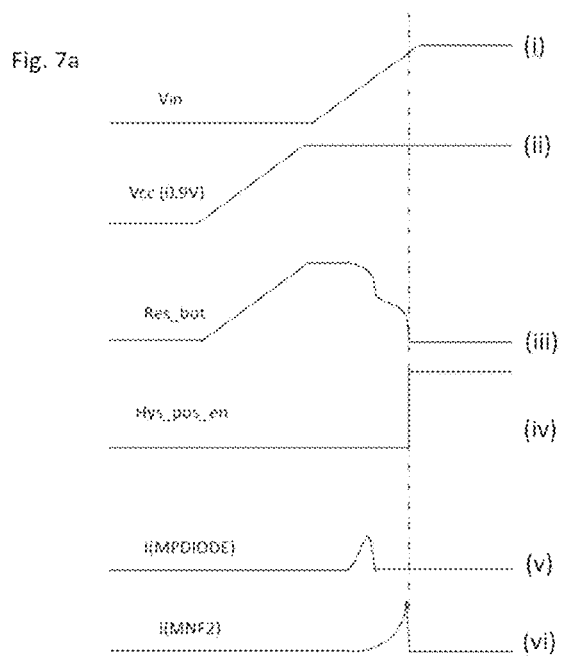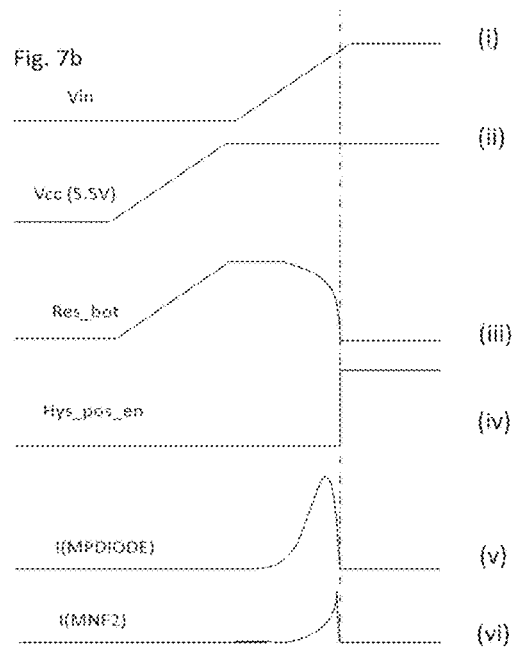

DUAL POWER SUPPLY DETECTION CIRCUIT

CROSS REFERENCE TO RELATED APPLICATION

This application claims the benefit under 35 U.S.C. § 119(a) of European Application No. 20155927.5 filed Feb. 6, 2020 the contents of which are incorporated by reference herein in their entirety.

BACKGROUND OF THE DISCLOSURE

1. Field of the Disclosure

The present disclosure relates to a dual power supply detection circuit. The present disclosure also relates to an integrated circuit comprising the power supply detection circuit and more particularly a logic integrated circuit.

2. Description of the Related Art

In power supply circuits for integrated circuits such as logic circuits, during power turn-on or ramp-up the DC supply voltage (or Vcc) will rise and eventually stabilise at a specific DC value. As the DC supply ramps-up, transistors in the power supply circuit go through subthreshold voltages before the voltage nodes, such the gate, source or drains reach the specific desired DC supply voltage (Vcc). Operation of the transistors at subthreshold voltages can lead to unwanted voltage pulses at the output of the power supply. Such unwanted voltage pulses, also known as glitches can cause unwanted behaviour in the integrated circuit to which the power supply circuit is connected.

A glitch may be defined as an unwanted voltage or signal on the output of an electronic circuit, such as a logic circuit. Looking at a generalised data transfer system as illustrated in FIG. 1, data is received at an input of a first logic circuit, SystemA. The output of the first logic circuit is connected to the input of a second circuit, SystemB, and the second circuit provides a data output for connection to further circuitry (not illustrated). During operation the second circuit may be enabled (in other words powered up) and ready to receive data from the first logic circuit but the first logic circuit may not be ready to transfer data to the enabled second circuit. In this situation, if there are any glitches, or unwanted voltages or signals generated by the first logic circuit, they will be transferred to the enabled second circuit. If the amplitude of the glitch is greater than an input threshold voltage of the second circuit the glitch will be processed by the second circuit which may lead to an erroneous and unwanted signal at the output of the second circuit. Currently the effects of the glitches can be reduced by synchronising the turn on of the electronic circuit supply voltage with the turn on of the second circuit.

However, synchronisation requires an additional timing signal between the two circuits which prevents switch on of the second circuit until the glitch has passed. Furthermore, with a slow rising power supply, a supply detection circuit usually enables the driver and other circuits drawing current from Vcc. When current is forced from power supply, the Vcc level can drop causing the threshold of supply detection to shift and may disable the output from returning to Vcc leading to voltage oscillations which can cause excess current.

Also high to low and low to high voltage transitions and a supply difference between Vcc and Vin in the two supply domains, the threshold voltage may not match. This mismatch may result in glitches.

SUMMARY

According to an embodiment there is provided a dual power supply detection circuit, comprising: first and second input stage field effect transistors; an inverter stage; a feedback stage field effect transistor; first and second compensation circuits; wherein the inverter stage comprises a complimentary pair of transistors, the complementary pair of transistors comprising an NMOS transistor and a PMOS transistor configured and arranged such that a gate lengths of the PMOS and NMOS transistors are different. Optionally, the inverter stage may comprise at least two complimentary pairs of transistors, comprising first and second NMOS transistors and first and second PMOS transistors; wherein the gate length of the first NMOS transistor is greater than the gate length of the first PMOS transistor, and the gate length of the second PMOS transistor is greater than the gate length of the second NMOS transistor. The gate length of feedback stage field effect transistor may be less than gate length of the input stage field effect transistor.

The dual power supply detection circuit may further comprise a feedforward stage, connected between an output of the input stage field effect transistor and an input of a NOR stage. The NOR stage may comprise first and second complimentary NMOS and PMOS transistors, wherein the gate length of the PMOS transistors is greater than the gate length of the NMOS transistors. The output of the inverter stage may be connected to first and second inputs of the NOR stage.

The gate length of the feedback stage field effect transistor may be less than the gate length of the input stage field effect transistor to provide a supply voltage hysteresis.

The dual power supply detection circuit may further comprise a second input stage transistor connected in series with the first input stage transistor.

The dual power supply detection circuit may further comprise a first resistor, a second resistor and a third resistor, wherein the first and second resistors are connected between a source and drain of the feedback stage field effect transistor and the third resistor is connected between the second resistor and a source of the input field effect transistor.

The total resistance of the first resistor, second resistor and third resistor may be greater than the drain source resistance of the input stage transistor.

The dual power supply detection circuit may further comprise: a first filter capacitor and a second filter capacitor configured and arranged to filter high frequency supply voltage ramps. The first filter capacitor may be connected between the first and second resistors and a second filter capacitor is connected.

The dual power supply detection circuit may further comprise a first current compensation branch and a second current compensation branch.

There is also provided an integrated circuit comprising a power supply detection circuit according to embodiments.

The integrated circuit may be a logic circuit comprising any one or more of: a buffer; an inverter; an AND gate; a NAND gate; an OR gate; a NOR gate; an Exclusive-NOR gate; or an Exclusive-OR gate.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

FIGS. 7a and 7b illustrate various waveforms (i) to (vi) during operation of the supply power supply detection circuit according to FIG. 3.

DETAILED DESCRIPTION

Figure 1:
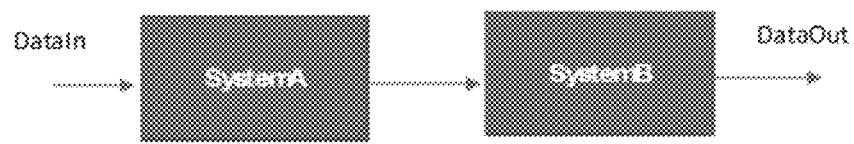
FIG. 1 shows a known generalised data transfer system.
Figure 2:
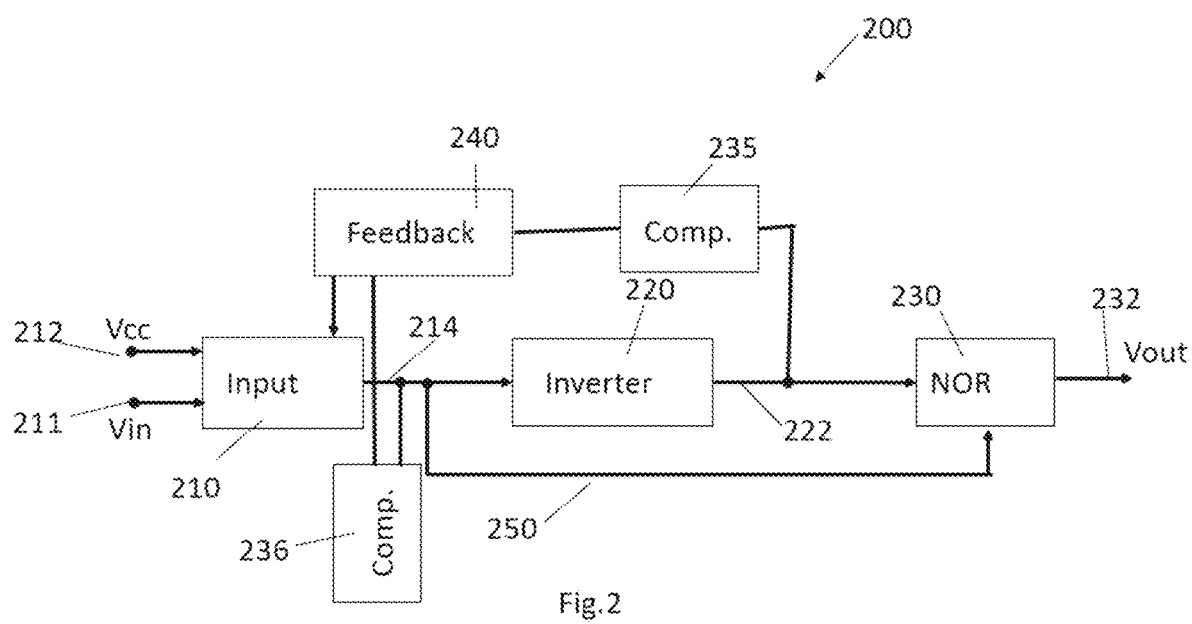
FIG. 2 illustrates a block diagram of a power supply detection circuit according embodiments.

FIG. 2 illustrates a generalised functional block diagram of a power supply detection circuit 200 according embodiments. In overview, the power supply detection circuit 200 comprises: an input stage 210; an inverter stage 220; a NOR stage 230; first and second compensation stages 235, 236; a feedback stage 240; and, a feedforward line 250.

The input stage 210 comprises a plurality of input terminals 211, 212. One input terminal receives a first input power supply voltage Vcc 212, and one input receives a second supply voltage Vin 211.

The input stage 210 comprises an output line 214 connected to the input of the inverter stage 220. An inverter output line 222 from the inverter stage 220 is connected to the NOR stage 230. In addition, the inverter output line 222 is also connected to a feedback stage 240, and the feedback stage 240 is in turn connected to the input stage 210. A feedforward loop 250 is connected from the output line 214 of the input stage an output line 232 of the NOR stage. The NOR stage output line 232 provides the output voltage Vout of the power supply detection circuit 200.

When the input power supply voltage—which is below a minimum operating voltage is present at the input of the input stage 210, the input stage 210 will partially turn on and cause an undefined voltage at the output of 210 which may cause an unwanted voltage pulse or glitch will be passed to the inverter stage 220. The inverter stage consists of three inverters with the purpose to filter the unwanted glitch by increasing the switch level of the first inverter stage and the third inverter. The dimension of the switch level at the second inverter is about 50% of Vcc.

The inverter 220 is configured to attenuate or reduce the amplitude of the voltage and glitch from the input stage 210.

The attenuated voltage and glitch from the inverter 220 is then feedback through the feedback stage 240 to the input stage 212.

The first compensation stage 235 is configured and arranged to compensate for threshold voltage variations when the input power supply voltage Vcc begins to rise. The second compensation stage 236 is configured and arranged to compensate for threshold voltage variations when the input power supply begins to fall. The first compensation stage 235 is connected as a feedback between the feedback stage 240 and the inverter stage 220. The second compensation stage 236 is connected between the feedback stage 240 and the output line 214 of the input stage 210.

The feedback stage 240 provides hysteresis, that is the voltage difference between a ramp-up threshold voltage (for example, Vcc1, as discussed below) and a ramp down threshold voltage. By using hysteresis, any fall in input power supply voltage which can cause false disable signals are prevented, thus preventing oscillations which can cause excess current and/or glitches in the output.

The output 222 of the inverter stage 220 is also connected to the input of the NOR stage. The NOR stage 230 this is used when the input power supply voltage begins to ramp down below threshold (for example Vcc2, as discussed below) and disables or bypasses the inverter stage 220.

Figure 3:
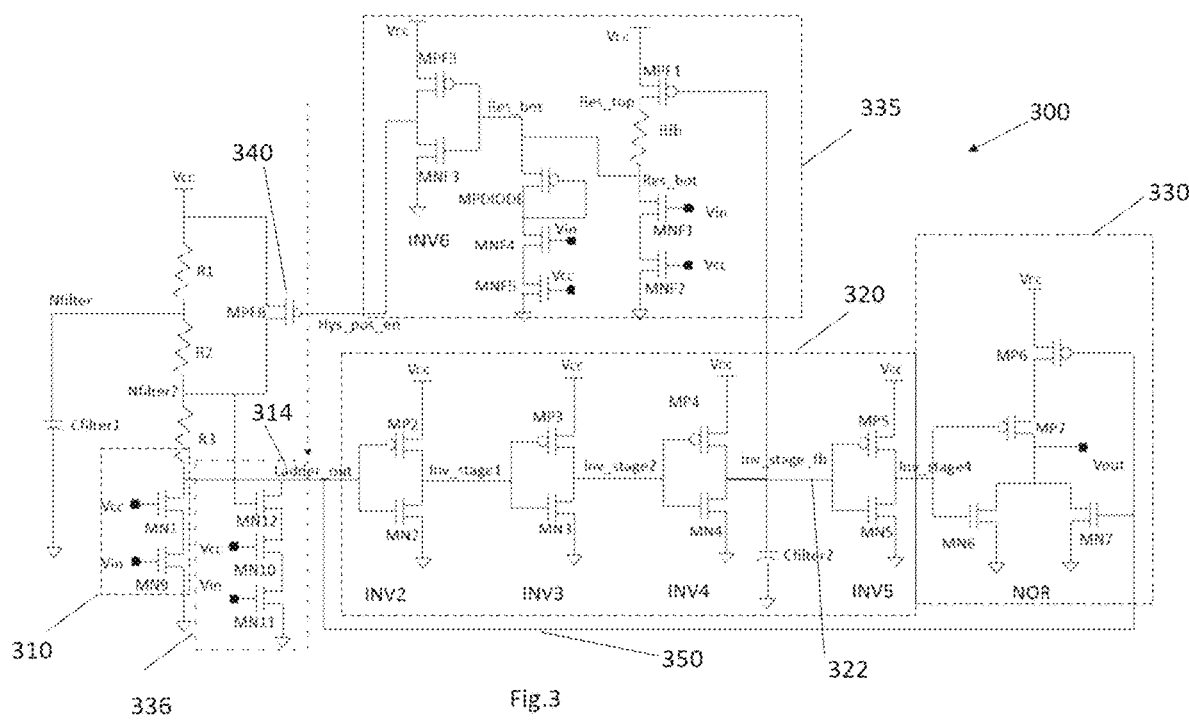
FIG. 3 illustrates a circuit diagram of a dual power supply detection circuit according embodiments.

FIG. 3 illustrates a circuit diagram, implementing a dual supply detection circuit 300 embodying the generalised functional block diagram of FIG. 2. The input stage 310 of the dual supply detection circuit 300 comprises a first input transistor MN1 having gate, source and drain terminals for receiving the first input power supply voltage Vcc. In addition, the input stage 310 comprises second input transistor MN9 for receiving the second supply voltage Vin. The second input transistor MN9 comprises gate, source and drain terminals. The drain of the first input transistor MN1 is connected to the source of the second input transistor MN9 such that the first input transistor is in series with the second input transistor. The drain of the second input transistor MN9 is connected to ground (or zero).

The source terminal of the input transistor MN1 forms the output terminal 314 of the input stage 310, and the drain terminal is connected to ground. The source terminal is also connected to the supply voltage Vcc via resistors R1, R2 and R3 and feedback transistor MPFB.

The output terminal 314 (ladder out) of the input stage 310 is connected to the input of the inverter stage 320. The inverter stage comprises series connected inverters. In this example the inverter stage comprises four, namely first inverter INV2, second inverter INV3, third inverter INV4 and fourth inverter INV5, however the skilled person will appreciate that the any number can be chosen. Each of the inverters INV2, INV3, INV4 and INV5 are formed of complimentary NMOS transistor and PMOS transistors, where the inverters are connected in series. The gates of the NMOS transistor MN2 and PMOS transistor MP2 are connected together and to the output 314 of the input stage 310. Likewise, the gates of the NMOS transistor MN3 and PMOS transistor MP3 are connected together, and so on for higher order complimentary NMOS and PMOS transistor pairs.

The source of each of the PMOS transistors MP2, MP3, MP4, MP5 are connected to the supply voltage Vcc. The drain terminals of each of the NMOS transistors MN2, MN3, MN4, MN5 are connected to ground. The drain terminals of the PMOS transistors MP2, MP3, MP4 are connected to respective source terminals of the NMOS transistors MN2, MN3, MN4 to form gate connections to the higher order inverters. For example, the drain terminal of the PMOS transistor MP2 is connected to the source terminal of the NMOS transistor MN2 which are in turn connected to the gate terminals of the PMOS transistors MP3 and NMOS transistors MN3. This forms a series connection of inverters INV2, INV3, INV4, INV5. For the final inverter in the series, in this case INV5, the drain terminal of the PMOS transistor MP5 is connected to the source terminal of the NMOS transistor MN5, and this connection forms the output of the inverter stage 320, which is connected to the feedback stage 340 and the input of the NOR stage 330 as discussed in more detail below.

The first inverter INV2 is formed of a PMOS transistor MP2 and an NMOS transistor MN2. The second inverter INV3 is formed of a PMOS transistor MP3 and an NMOS transistor MN3. The third inverter INV4 is formed of a PMOS transistor MP4 and an NMOS transistor MN4. The fourth inverter INV5 is formed of a PMOS transistor MP5 and an NMOS transistor MN5.

Each of the first, second, third and fourth inverters are arranged such that gate lengths, L, of the PMOS and NMOS transistors of each inverter are not equal. More specifically, the gate length LMP2 of the PMOS transistor MP2 is greater than the gate length LMN2 of the NMOS transistor MN2. Likewise, the gate length LMN3 of the NMOS transistor MN3 is greater than the gate length LMP3 of the PMOS transistor MP3. In addition, the gate length LMP4 of the PMOS transistor MP4 is greater than the gate length LMN4 of the NMOS transistor MN4. The gate length LMN5 of the NMOS transistor MN5 is greater than the gate length LMP5 of the PMOS transistor MP5. The skilled person will see that the relative gate lengths alternate for each subsequent inverter may can be given more generally by:

$LPn>LNn, LNn>LPn$

In this way the gate lengths of the present embodiment can be described as follows:

$LMP2>LMN2, LMN3>LMP3, LMP4>LMN4$ and $LMN5>LMP5$

This arrangement of gate lengths ensures that alternating transistors follow the power supply voltage, Vcc and ground. During power supply voltage ramp up, when the gate length of NMOS transistors is greater than the gate length of the corresponding PMOS transistor, the subthreshold current of the PMOS transistor in the complimentary pair dominates the corresponding NMOS transistor of the complimentary pair. Conversely, when the gate length of PMOS transistor is greater than the gate length of corresponding NMOS transistor, the subthreshold current of NMOS transistor dominates the PMOS transistor.

In this way, when the gate length of a PMOS transistor is greater than the gate length of the corresponding NMOS transistor the inverter output to will be pulled low as subthreshold current of NMOS transistor dominates that of corresponding PMOS transistor. Similarly, when the gate length of an NMOS transistor is greater than the gate length of the corresponding PMOS transistor, the inverter output to will follow the power supply voltage Vcc because the subthreshold current of PMOS transistor dominates that of corresponding NMOS transistor.

The skilled person will see therefore that first inverter INV2 output has a preference to follow ground, the second inverter INV3 has a preference to follow the supply voltage Vcc, the third inverter INV4 has a preference to ground, and the fourth inverter INV5 has a preference to follow the supply voltage Vcc during power supply ramp up. This arrangement can attenuate any glitches that occur in any of the stages during power supply voltage ramp-up.

The number of inverters may be chosen dependent of the required amount of attenuation and the available area on the integrated circuit design. The skilled person will appreciate that a higher number of inverters will give increased attenuation but at the loss of available area on the integrated circuit design.

As mentioned above the output of the inverter stage 320 is connected to the input of the NOR stage 330. The NOR stage 330 is arranged as a two input NOR gate, where the first inputs A, are connected to the output of the fourth inverter INV5, and the second inputs B are connected to the output transistor MN1 via a feedforward loop 350. The first inputs A are formed by gates of two complimentary transistors MN6 and MP7. The second inputs B, are formed by the gates of complimentary transistors MN7 and MP6.

The output of the NOR stage 330 and thus the output 332 of the single supply detection circuit 300 is arranged at the node of the drain terminal of transistor MP7, the source terminal of transistor MN6 and source terminal of transistor MN7. The NOR stage 330 is configured and arranged to disable the inverter stage when the supply voltage ramps down.

The gate lengths of the NMOS and PMOS transistors forming NOR stage are arranged such that the gate length of transistors MP6 and MP7 are greater than the gate lengths transistors MN6 and MN7.

Looking back to the inverter stage 320, the output 322 is connected to the first compensation stage 335. The first compensation stage 335 is enabled when the input voltage Vin is rising and solves the problem of threshold voltage variation when the input voltage Vin is rising. When Vcc is high and Vin is ramping up from 0V, the first compensation stage 335 is enabled. Since the output 322 of the inverter stage 320 is at 0V, transistor MPF1 is switched on and operates in triode mode and because of this the first compensation stage is designed to draw higher current when either Vcc or Vin, or both Vcc and Vin are ramping up. This enables higher threshold voltages when either Vcc or Vin are ramping up.

Feedback resistor Rfb functions to set the potential at node Res_bot and equalise the current between the two branches MPDIODE and Res_top. At low Vcc levels branch Res_top conducts the current. The second branch is switched on at higher Vcc levels to redirect the current which limits the current through branch Res_top and keeps voltage on node Res_bot substantially constant. MNF1 and MNF2 have the same purpose as MN1 and MN9, as described above.

The node of resistor Rfb and transistor MNF1 is connected the source of a transistor MPDIODE and a further inverter INV6 formed of complementary n- and p-channel transistors MPF3, MNF3 is connected to the drain of the transistor MPDIODE. The transistor MPDIODE is connected configured as a diode connected transistor, whereby the gate thereof is connected to the drain. MNF4 and MNF5 turn on at higher Vcc levels with respect to MN1 and MN9.

When Vcc is minimum and Vin is rising the transistor MPDIODE connected like a diode reduces the current through the branch MNF4 and MNF5. Conversely, when Vcc is maximum and Vin is rising the current through the transistor MPDIODE will be higher than the current through the transistors MNF1 and MNF2. As a result, the variation of threshold voltage of the overall system when rising of Vin, can be minimised for different Vcc values, for example where Vcc is maximum or where Vcc is minimum. The current compensation branch defined by MPDIODE, MNF4 and MNF5 allows for control of the current through MNF1 and MNF2 may be included to further minimise the threshold voltage variation. By adding multiple branches the current through the circuit will be averaged over each branch and thus decrease the Vt variation.

The second compensation circuit 336 is connected to the node of the resistor R2 and R3 and the output of the output transistor MN1 and ground. As mentioned, the second compensation stage 236 is configured and arranged to compensate for threshold voltage variations when the input power supply begins to fall. When Vin or Vcc are above the threshold voltage, the first compensation circuit 335 is disabled by causing the voltage at the gate of feedback transistor MPFB to go high, thereby disabling feedback transistor MPFB and the resistors R1 and R2 are enabled and added to resistor R3 and the compensation circuit 335 enters into low power mode because low power mode operation has a small static current consumption (also called small quiescent current).

When Vcc is high and Vin is falling transistor MN12 is turned on and conducts more current than MN1, such that less current flows through MN1 thus equalising the Vt level at high Vcc levels between MN1 and MN9 to realize glitch reduction. Likewise, when Vcc is low and Vin falling, transistor MN12 is turned off and conducts less current than MN1, such that more current flows through MN1. This allows equalisation of the Vt level at high Vcc levels between MN1 and MN9 thus resulting in glitch reduction for the scenario where Vcc is low and Vin is falling. As a result, the variation of threshold voltage can be minimised for different Vcc values, for example where Vcc is maximum or where Vcc is minimum, when Vin is falling.

The output of the first compensation stage 335 is connected to the to the feedback stage 340. The feedback stage comprises a feedback transistor MPFB and network of resistors R1, R2 and R3 connected thereto, to limit the current from supply voltage Vcc to ground through the input transistor MN1. The feedback transistor MPFB may be PMOS transistor and the output 322 is connected to the gate terminal thereof. The network of resistors R1, R2 and R3 are provided to limit the flow of current from supply voltage Vcc to ground. Specifically, as the supply voltage ramps up and is detected at the input stage, the n-channel transistor MN1 turns on and draws current from the supply voltage Vcc. The resistive network R1, R2 and R3 limits the shoot through current from supply to ground and prevents static currents. The gate length LMN1 of the input transistor MN1 is greater than the gate length LMPFB of the feedback transistor MPFB. The feedback arrangement described above provides hysteresis as discussed in more detail above.

Optionally, a first filter capacitor Cfilter1 may be connected at the node between resistors R2 and R1. Likewise, a second filter capacitor Cfilter2 may be connected between the output of inverter INV4 and the input of inverter INV5. Filter capacitors Cfilter1 and Cfilter2 may be provided to filter high frequency ramps. This enables the power supply to be switched at high frequencies by holding voltage constant on capacitor Cfilter1 as the supply ramps down, whereas capacitor Cfilter2 filters voltage during supply ramp up.

Due to the inclusion of the second input transistor MN9, when both the supply voltage Vcc and the second supply voltage Vin are greater than the threshold voltage, the output voltage Vout will follow Vcc. Alternatively, when either the supply voltage Vcc or the second supply voltage Vin are less than the threshold voltage, Vout will be zero. The operation of the dual supply detection circuit 300 together with the first and second compensation circuits 335, 336 can be understood with reference to the scenarios illustrated in FIGS. 4 to 7b.

Figure 4:
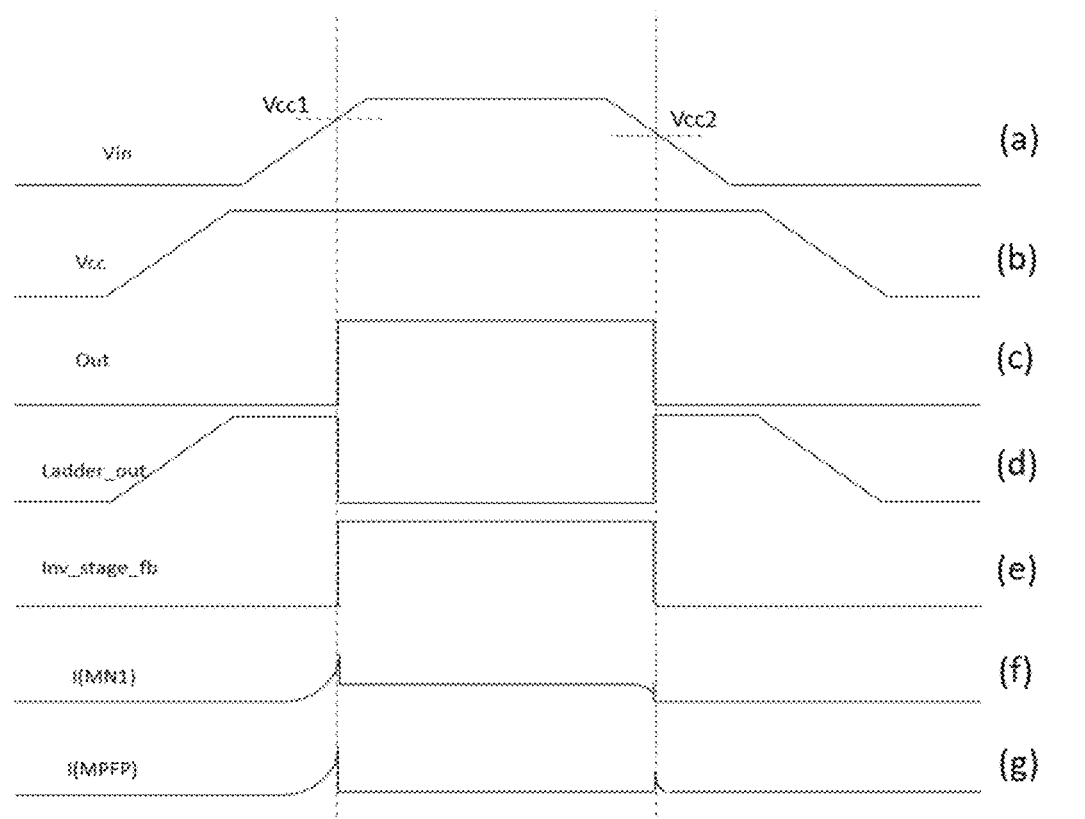
FIG. 4 illustrates various waveforms (a) to (h) during operation of the supply power supply detection circuit according to FIG. 3.

The waveforms (a) to (g) of FIG. 4 show the operation of the dual supply detection circuit 300 according to FIG. 3, when the second supply voltage Vin (waveform (a)) is enabled (or high) after the first supply voltage Vcc (waveform (b)) is enabled, and when the second supply voltage Vin is disabled (or low) before the first supply voltage Vcc is disabled. As shown in waveform (c) the output voltage Vout remains low whilst Vin is below Vcc1 (on the rising edge of Vin) and whilst Vin is below Vcc2 (on the falling edge of Vin).

Figure 5:
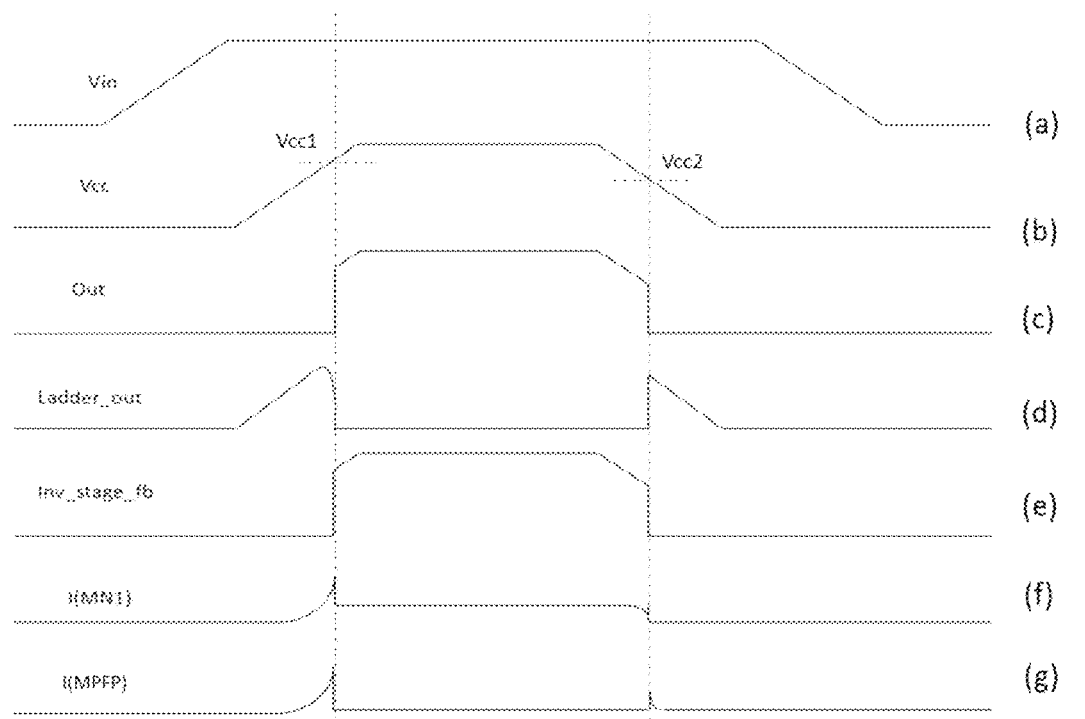
FIG. 5 illustrates various waveforms (a) to (h) during operation of the supply power supply detection circuit according to FIG. 3.

The waveforms (a) to (g) of FIG. 5 show the operation of the circuit according to FIG. 3, when the first supply voltage Vcc (waveform (b)) is enabled (or high) after the second supply voltage Vin (waveform (a)) is enabled, and the first supply voltage Vcc is disabled (or low) before the second supply voltage Vin is disabled. As shown in waveform (c) the output voltage Vout remains low whilst the first supply voltage Vcc is below the threshold Vcc1 (on the rising edge of Vcc) and whilst the first supply voltage Vcc is below the threshold Vcc2 (on the falling edge of Vcc).

Figure 6:
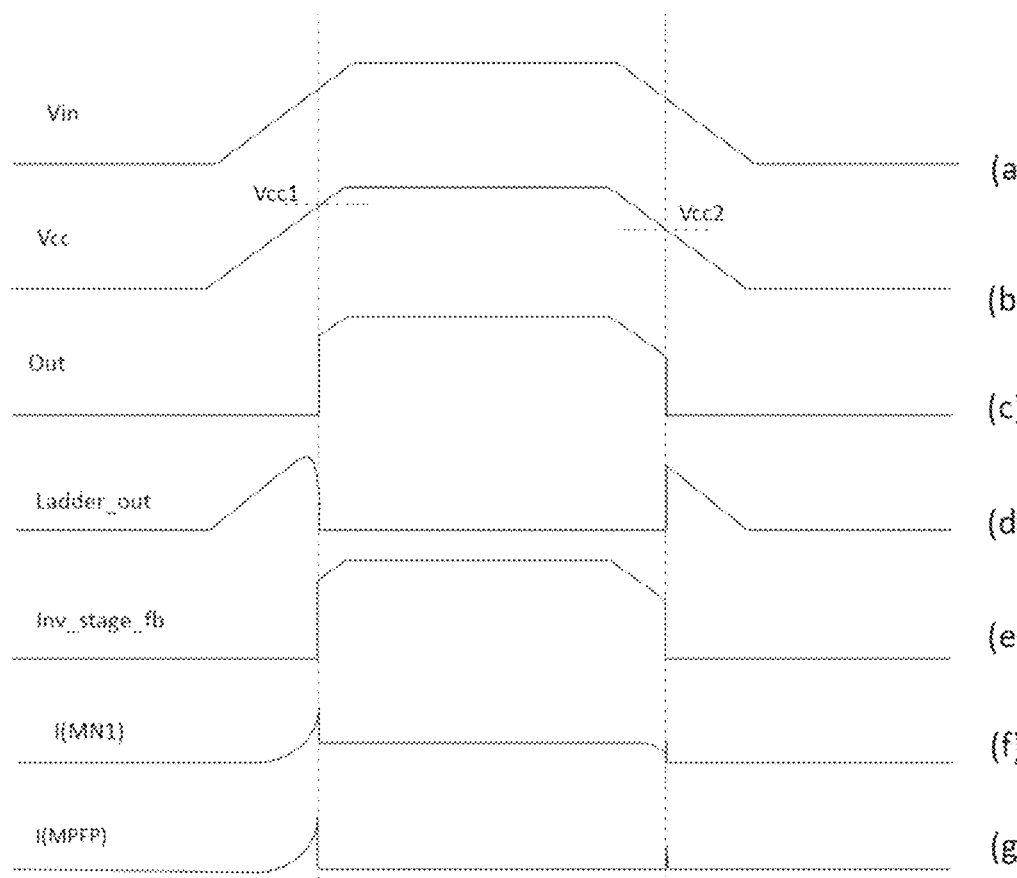
FIG. 6 illustrates various waveforms (a) to (h) during operation of the supply power supply detection circuit according to FIG. 3.

The waveforms (a) to (g) of FIG. 6 show the operation of the circuit as described above with respect to FIG. 3. In FIG. 6, the first supply voltage Vcc (waveform (b)) and the second supply voltage Vin (waveform (a)) are enabled simultaneously. The waveforms (c) to (e) of FIG. 6 are the same as those described above with respect to the waveforms (f) and (g) of FIG. 4 and show the behaviour of the current when the first supply voltage Vcc (waveform (b)) and the second supply voltage Vin (waveform (a)) are ramping up and down.

When the first supply voltage Vcc is ramping up and below Vcc1, the feedback transistor MPFB is switched on and the current continues to increase exponentially as long as transistor MN1 is in saturation. As shown in waveform (d), the output voltage falls due to an increase in the gate voltage of MN1. Transistor MPFB turns off and the current through MPFB falls to zero. The current through transistor MN1 is limited by the sum of the resistances R1, R2 and R3 as illustrated in waveform (g). Similarly when the supply ramps down and below Vcc2, transistor MPFB again turns on and conducts current until Vcc reaches a level where the transistor MPFB is switched off.

Figure 8A:
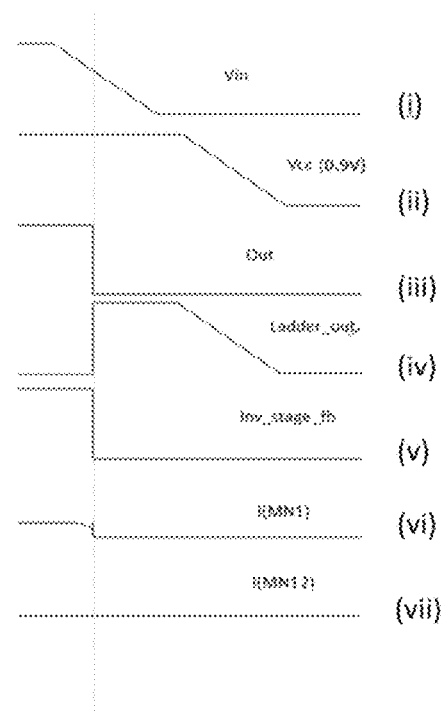
FIGS. 8a and 8b illustrate various waveforms (i) to (vi) during operation of the supply power supply detection circuit according to FIG. 3.

FIG. 7a depicts various waveforms when Vin is rising and Vcc is at 0.9V. This shows the behavior of current through two parallel current paths in the feedback network, namely the current through transistor MPDIODE and the current through transistor MNF2. As Vin rises, the current through MPDIODE reduces to zero and all the current flows through MNF2. The signal Hys_pos_en becomes high when voltage on Res_bot reaches the threshold voltage of INV6 which disables the feedback path. FIG. 7b depicts various waveforms when Vin is rising and Vcc is at 5.5V. These waveforms are compared with FIG. 7a. The current through MPDIODE continues to rise as Vin rises and only small portion of current flows through MNF2. Now the current through MNF2 is same as that of FIG. 7a. This compensation allows to limit the variation of threshold voltage Vt with variation of Vcc. FIG. 8a depicts various waveforms when Vin is falling and Vcc is at 0.9V. The current through MN12 is zero as Vcc is at 0.9V.

Figure 8B:
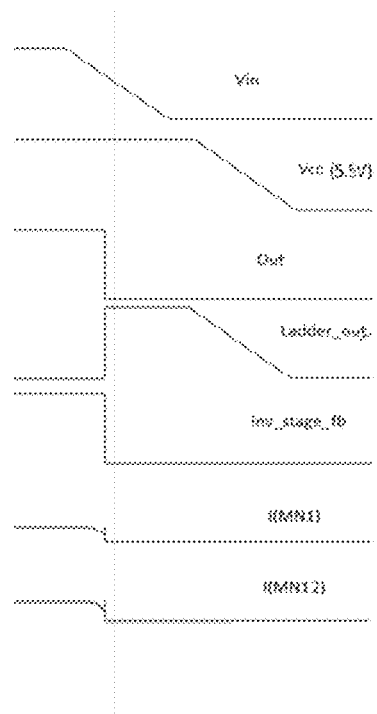

FIG. 8b depicts various waveforms when Vin is falling and Vcc is at 5.5V. Part of the current of resistor ladder flows through MN12 and only small portion of current flows through MN1. This compensation applies when Vin is falling and the variation of falling threshold voltage is minimal.

The power supply detection circuit according to embodiments may be implemented as part of a larger functional circuit such as an integrated circuit (IC). The functional circuit may be a logic circuit such as a buffer; an inverter; an AND gate; a NAND gate; an OR gate; a NOR gate; an Exclusive-NOR gate; or an Exclusive-OR gate. Likewise the functional circuit may be any appropriate combination of the above mentioned logic circuits.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A dual power supply detection circuit, comprising:
   first and second input stage field effect transistors;
   an inverter stage comprising at least two complimentary pairs of transistors, comprising first and second NMOS transistors and first and second PMOS transistors, wherein the gate length of the first NMOS transistor is greater than the gate length of the first PMOS transistor, and wherein the gate length of the second PMOS transistor is greater than the gate length of the second NMOS transistor;
   a feedback stage field effect transistor; and
   first and second compensation circuits.

2. The dual power supply detection circuit of claim 1, wherein the feedback stage field effect transistor has a gate length that is less than a gate length of the input stage field effect transistors.

3. The dual power supply detection circuit of claim 1, further comprising a feedforward stage, connected between an output of the input stage field effect transistors and an input of a NOR stage.

4. The dual power supply detection circuit of claim 1, wherein the second input stage field effect transistor is connected in series with the first input stage field effect transistor.

5. The dual power supply detection circuit of claim 1, further comprising a first filter capacitor and a second filter capacitor configured and arranged to filter high frequency supply voltage ramps.

6. The dual power supply detection circuit of claim 5, further comprising a first resistor and a second resistor, wherein the first filter capacitor is connected between the first and second resistors and a second filter capacitor is connected between an output of an inverter and the input of another inverter.

7. An integrated circuit comprising a dual power supply detection circuit as claimed in claim 1.

8. The integrated circuit of claim 7, wherein the integrated circuit is a logic circuit comprising at least one component selected from the group consisting of a buffer, an inverter, an AND gate, a NAND gate, an OR gate, a NOR gate, an Exclusive-NOR gate, an Exclusive-OR gate, and combinations thereof.

9. A dual power supply detection circuit, comprising:
   first and second input stage field effect transistors;
   an inverter stage comprising a complimentary pair of transistors, the complementary pair of transistors further comprising an NMOS transistor and a PMOS transistor configured and arranged so that a gate length of the PMOS transistor and a gate length of the NMOS transistor are different;
   a feedback stage field effect transistor; and
   first and second compensation circuits;
   wherein the feedback stage field effect transistor has a gate length that is less than a gate length of the input stage field effect transistors.

10. The dual power supply detection circuit of claim 9, further comprising a feedforward stage, connected between an output of the input stage field effect transistors and an input of a NOR stage.

11. The dual power supply detection circuit of claim 9, wherein the gate length of the feedback stage field effect transistor is less than the gate length of the input stage field effect transistors to provide a supply voltage hysteresis.

12. A dual power supply detection circuit, comprising:
   first and second input stage field effect transistors;
   an inverter stage comprising a complimentary pair of transistors, the complementary pair of transistors further comprising an NMOS transistor and a PMOS transistor configured and arranged so that a gate length of the PMOS transistor and a gate length of the NMOS transistor are different;
   a feedback stage field effect transistor;
   first and second compensation circuits; and a feedforward stage, connected between an output of the input stage field effect transistors and an input of a NOR stage.

13. The dual power supply detection circuit of claim 12, wherein the NOR stage comprises first and second complimentary NMOS and PMOS transistors, and wherein the gate length of the PMOS transistors is greater than the gate length of the NMOS transistors.

14. The dual power supply detection circuit of claim 13, wherein the output of the inverter stage is connected to first and second inputs of the NOR stage.

15. A dual power supply detection circuit, comprising:
   first and second input stage field effect transistors;
   an inverter stage comprising a complimentary pair of transistors, the complementary pair of transistors further comprising an NMOS transistor and a PMOS transistor configured and arranged so that a gate length of the PMOS transistor and a gate length of the NMOS transistor are different;

a feedback stage field effect transistor;
first and second compensation circuits; and
a first resistor, a second resistor and a third resistor, wherein the first and second resistors are connected between a source and a drain of the feedback stage field effect transistor and the third resistor is connected between the second resistor and a source of the input stage field effect transistors.

16. The dual power supply detection circuit of claim 15, wherein the first resistor, the second resistor and the third resistor have a total resistance that is greater than a drain source resistance of the input stage field effect transistors.

17. A dual power supply detection circuit, comprising:
first and second input stage field effect transistors;
an inverter stage comprising a complimentary pair of transistors, the complementary pair of transistors further comprising an NMOS transistor and a PMOS transistor configured and arranged so that a gate length of the PMOS transistor and a gate length of the NMOS transistor are different;
a feedback stage field effect transistor;
first and second compensation circuits; and
a first current compensation branch and a second current compensation branch.

\* \* \* \* \*